US008911647B2

(12) United States Patent
Cho et al.

(10) Patent No.: US 8,911,647 B2
(45) Date of Patent: Dec. 16, 2014

(54) PHOTOSENSITIVE RESIN COMPOSITION FOR COLOR FILTER AND COLOR FILTER USING THE SAME

(71) Applicant: Cheil Industries, Inc., Gumi-si (KR)

(72) Inventors: Sang-Won Cho, Uiwang-si (KR); Won-A Noh, Uiwang-si (KR); Soo-Young Heo, Uiwang-si (KR); Han-Chul Hwang, Uiwang-si (KR); Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/067,190

(22) Filed: Oct. 30, 2013

(65) Prior Publication Data
US 2014/0175346 A1 Jun. 26, 2014

(30) Foreign Application Priority Data

Dec. 24, 2012 (KR) .......................... 10-2012-0152470

(51) Int. Cl.
*G02B 5/23* (2006.01)
*G02B 1/04* (2006.01)
*G03F 7/032* (2006.01)
*G02B 5/22* (2006.01)

(52) U.S. Cl.
CPC . *G02B 1/04* (2013.01); *G03F 7/032* (2013.01)
USPC ........... 252/586; 252/582; 257/432; 359/891; 430/7; 430/270.1; 430/285.1; 430/286.1; 430/434; 552/101

(58) Field of Classification Search
USPC ............ 252/586, 582; 430/5, 7, 270.1, 281.1, 430/286.1, 311, 396, 905, 285.1, 434; 522/18, 74, 184; 257/432; 359/891; 552/101
See application file for complete search history.

(56) References Cited

U.S. PATENT DOCUMENTS

| | | | |
|---|---|---|---|
| 5,733,714 A | 3/1998 | McCuloch et al. | |
| 8,212,974 B2 | 7/2012 | Ohkuma | |
| 8,282,862 B1 * | 10/2012 | Kim et al. ................... | 252/582 |
| 2003/0229147 A1 | 12/2003 | Indig | |
| 2005/0192379 A1 | 9/2005 | Kwan | |
| 2010/0271578 A1 | 10/2010 | Ohkuma | |
| 2013/0141810 A1 * | 6/2013 | Lee et al. ..................... | 359/891 |

FOREIGN PATENT DOCUMENTS

| | | | | |
|---|---|---|---|---|
| CN | 1232552 | A | 10/1999 | |
| JP | 2000-95805 | A | 4/2000 | |
| JP | 2000-095960 | * | 4/2000 | .............. C09B 55/00 |
| JP | 2001-124919 | A | 5/2001 | |
| JP | 2001-125098 | A | 5/2001 | |
| JP | 2004-315594 | | 11/2004 | |
| JP | 2009-001770 | A | 1/2009 | |
| JP | 2010256598 | A | 11/2010 | |
| JP | 20116886 | A | 4/2011 | |
| JP | 2013-025194 | * | 2/2013 | .............. G02B 5/20 |
| KR | 10-2004-0053964 | A | 6/2004 | |
| KR | 10-2005-0042416 | A | 5/2005 | |
| KR | 10-2008-0007313 | A | 1/2008 | |
| KR | 10-2010-0042173 | A | 4/2010 | |
| KR | 10-2010-0045771 | A | 5/2010 | |
| KR | 10-2010-0063537 | A | 6/2010 | |
| KR | 10-2012-0075950 | A | 7/2012 | |
| KR | 10-2013-0053171 | A | 5/2013 | |
| WO | 2010123071 | A1 | 10/2010 | |
| WO | 2012/091224 | A1 | 7/2012 | |

OTHER PUBLICATIONS

Third-Party submission received in commonly owned U.S. Appl. No. 13/652,661 dated Feb. 5, 2014, pp. 1-69.
Third-Party submission received in commonly owned U.S. Appl. No. 13/652,661 dated Feb. 20, 2014, pp. 1-231.
Office Action in commonly owned U.S. Appl. No. 13/652,661 dated Mar. 28, 2014, pp. 1-13.
Search Report in commonly owned Chinese Application No. 201210382429.2 dated Mar. 6, 2014, pp. 1-2.
English-translation of Search Report in commonly owned Chinese Application No. 201210382429.2 dated Mar. 6, 2014, pp. 1-2.

* cited by examiner

*Primary Examiner* — Bijan Ahvazi
(74) *Attorney, Agent, or Firm* — Additon, Higgins & Pendleton, P.A.

(57) ABSTRACT

Disclosed is a photosensitive resin composition for a color filter including (A) a dye-polymer composite wherein the dye includes a repeating unit derived from a compound represented by the following Chemical Formula 1, wherein in Chemical Formula 1, each substituent is the same as defined in the detailed description; (B) a binder resin; (C) a photopolymerizable monomer; (D) a photopolymerization initiator; and (E) a solvent.

[Chemical Formula 1]

11 Claims, No Drawings

PHOTOSENSITIVE RESIN COMPOSITION FOR COLOR FILTER AND COLOR FILTER USING THE SAME

CROSS-REFERENCE TO RELATED APPLICATION

This application claims priority to and the benefit of Korean Patent Application No. 10-2012-0152470 filed in the Korean Intellectual Property Office on Dec. 24, 2012, the entire disclosure of which is incorporated herein by reference.

FIELD OF THE INVENTION

This disclosure relates to a photosensitive resin composition for a color filter and a color filter using the same.

BACKGROUND OF THE INVENTION

In general, a color filter is used for a liquid crystal display (LCD), an optical filter for a camera, and the like. It is manufactured by coating a fine region colored with three or more colors on a charge coupled device or a transparent substrate.

The colored thin film can be commonly manufactured by dyeing, printing, electrophoretic deposition (EPD), pigment dispersion, and the like. The color filter is prepared through many chemical treatments during the manufacturing process.

Accordingly, in order to maintain a pattern formed under the aforementioned condition, a color photosensitive resin is required to have a development margin but chemical resistance to thus improve yield of a color filter.

Particularly, since a color filter of a liquid crystal display device is formed on a TFT array panel using color filter-on-array (COA) method, a process of forming a transparent electrode on a color filter is needed.

The transparent electrode may be fabricated by sequentially forming a transparent conductive layer and a photosensitive resin layer on a color filter, exposing and developing and patterning the photosensitive resin layer, and etching the transparent conductive layer with a use of the patterned photosensitive resin layer.

The color filter is required to have a chemical resistance because the color filter may be exposed to diverse liquid chemicals, such as a stripping solution for developing the photosensitive resin layer. Also, the color filter is required to have a heat resistance because a plurality of heat treatments is required to form the color filter.

SUMMARY OF THE INVENTION

One embodiment provides a photosensitive resin composition that can have excellent heat resistance and chemical resistance.

Another embodiment provides a color filter manufactured using the photosensitive resin composition for a color filter.

In one embodiment of the present invention, a photosensitive resin composition for a color filter includes (A) a dye-polymer composite wherein the dye includes a repeating unit derived from a compound represented by the following Chemical Formula 1; (B) a binder resin; (C) a photopolymerizable monomer; (D) a photopolymerization initiator; and (E) a solvent.

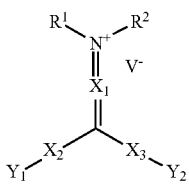

[Chemical Formula 1]

In the above Chemical Formula 1, $X_1$ is substituted or unsubstituted C3 to C30 cycloalkenylene, substituted or unsubstituted C3 to C30 heterocycloalkenylene, or a combination thereof, $X_2$ and $X_3$ are the same or different and are each independently substituted or unsubstituted C6 to C30 arylene, substituted or unsubstituted C6 to C30 alkylarylene, substituted or unsubstituted C3 to C30 heteroarylene, or a combination thereof, $Y_1$ is $-NR^3R^4$, $-OR^5$, or $-SR^6$, $R^1$ to $R^6$ are the same or different and are each independently hydrogen, substituted or unsubstituted C1 to C30 alkyl, substituted or unsubstituted C3 to C30 cycloalkyl, substituted or unsubstituted C6 to C30 aryl, substituted or unsubstituted C6 to C30 alkylaryl, substituted or unsubstituted C3 to C30 heteroaryl, or a combination thereof, $Y_2$ is $-NR^{20}R^{21}$, $-OR^{22}$ or $-SR^{23}$, $R^{20}$ and $R^{21}$ are the same or different and are each independently hydrogen, substituted or unsubstituted C1 to C30 alkyl, substituted or unsubstituted C3 to C30 cycloalkyl, substituted or unsubstituted C6 to C30 aryl, substituted or unsubstituted C6 to C30 alkylaryl, substituted or unsubstituted C3 to C30 heteroaryl, substituted or unsubstituted (meth)acrylate, or a combination thereof, wherein at least one of $R^{20}$ and $R^{21}$ is C1 to C30 alkyl substituted with a (meth)acrylate group, C3 to C30 cycloalkyl substituted with a (meth)acrylate group, C6 to C30 aryl substituted with a (meth)acrylate group, C6 to C30 alkylaryl substituted with a (meth)acrylate group, C3 to C30 heteroaryl substituted with a (meth)acrylate group, or a (meth)acrylate group, $R^{22}$ and $R^{23}$ are the same or different and are each independently C1 to C30 alkyl substituted with a (meth)acrylate group, C3 to C30 cycloalkyl substituted with a (meth)acrylate group, C6 to C30 aryl substituted with a (meth)acrylate group, C6 to C30 alkylaryl substituted with a (meth)acrylate group, C3 to C30 heteroaryl substituted with a (meth)acrylate group, or a (meth)acrylate group, and $V^-$ is a counter ion of $N^+$.

The compound represented by the above Chemical Formula 1 may include a compound represented by the following Chemical Formula 3.

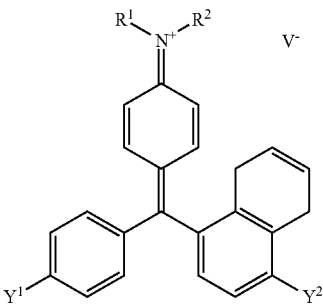

[Chemical Formula 3]

In the above Chemical Formula 3, $Y_1$ is $-NR^3R^4$, $-OR^5$, or $-SR^6$, $R^1$ to $R^6$ are the same or different and are each independently hydrogen, substituted or unsubstituted C1 to C30 alkyl, substituted or unsubstituted C6 to C30 aryl, substituted or unsubstituted C6 to C30 alkylaryl, substituted or unsubstituted C3 to C30 heteroaryl, or a combination thereof, $Y_2$ is $-NR^{20}R^{21}$, $-OR^{22}$ or $-SR^{23}$, $R^{20}$ and $R^{21}$ are the same or different and are each independently hydrogen, substituted or unsubstituted C1 to C30 alkyl, substituted or unsubstituted C3 to C30 cycloalkyl, substituted or unsubstituted C6 to C30 aryl, substituted or unsubstituted C6 to C30 alkylaryl, substituted or unsubstituted C3 to C30 heteroaryl, substituted or unsubstituted (meth)acrylate, or a combination thereof, wherein at least one of $R^{20}$ and $R^{21}$ is C1 to C30 alkyl substituted with a (meth)acrylate group, C3 to C30 cycloalkyl substituted with a (meth)acrylate group, C6 to C30 aryl substituted with a (meth)acrylate group, C6 to C30 alkylaryl substituted with a (meth)acrylate group, C3 to C30 heteroaryl substituted with a (meth)acrylate group, or a (meth)acrylate group, $R^{22}$ and $R^{23}$ are the same or different and are each independently C1 to C30 alkyl substituted with a (meth)acrylate group, C3 to C30 cycloalkyl substituted with a (meth)acrylate group, C6 to C30 aryl substituted with a (meth)acrylate group, C6 to C30 alkylaryl substituted with a (meth)acrylate group, C3 to C30 heteroaryl substituted with a (meth)acrylate group, or a (meth)acrylate group, and $V^-$ is a counter ion of $N^+$.

The compound represented by the above Chemical Formula 1 may include a compound represented by the following Chemical Formula 4.

[Chemical Formula 4]

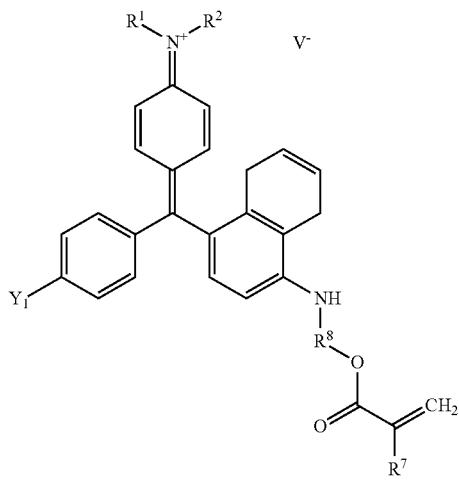

In the above Chemical Formula 4, $Y_1$ is $-NR^3R^4$, $-OR^5$, or $-SR^6$, $R^1$ to $R^6$ are the same or different and are each independently hydrogen, substituted or unsubstituted C1 to C30 alkyl, substituted or unsubstituted C6 to C30 aryl, substituted or unsubstituted C6 to C30 alkylaryl, substituted or unsubstituted C3 to C30 heteroaryl, or a combination thereof, $R^7$ is hydrogen or methyl, $R^8$ is a single bond, substituted or unsubstituted C1 to C30 alkylene, substituted or unsubstituted C3 to C30 cycloalkylene, substituted or unsubstituted C6 to C30 arylene, substituted or unsubstituted C6 to C30 alkylarylene, or substituted or unsubstituted C3 to C30 heteroarylene,

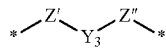

(wherein Z' and Z" are the same or different and are each independently C1 to C30 alkylene, and $Y_3$ is $-N(H)-$, $-S-$ or $-O-$, or a combination thereof), and $V^-$ is a counter ion of $N^+$.

The repeating unit derived from a compound represented by the above Chemical Formula 1 may included in an amount of about 0.1 to about 70 wt % based on total amount (100 wt %) of the dye-polymer composite (A).

The photosensitive resin composition for a color filter may include about 0.5 to about 50 wt % of the dye-polymer composite (A); about 0.5 to about 20 wt % of the binder resin (B); about 0.5 to about 20 wt % of the photopolymerizable monomer (C); about 0.1 to about 10 wt % of the photopolymerization initiator (D); and a balance amount of the solvent (E).

The dye-polymer composite (A) may have a weight average molecular weight (Mw) of about 1,000 to about 500,000 g/mol.

The dye-polymer composite (A) may further include at least one of repeating units represented by the following Chemical Formulae 5 to 7, or a combination thereof.

[Chemical Formula 5]

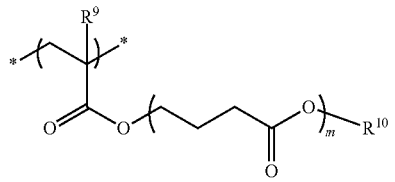

[Chemical Formula 6]

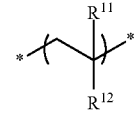

[Chemical Formula 7]

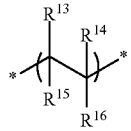

In the above Chemical Formulae 5 to 7, $R^9$, $R^{10}$, $R^{11}$, $R^{13}$, and $R^{14}$ are the same or different and are each independently hydrogen, substituted or unsubstituted C1 to C30 alkyl, substituted or unsubstituted C6 to C30 aryl, substituted or unsubstituted C6 to C30 alkylaryl, or a combination thereof, $R^{12}$ is substituted or unsubstituted C1 to C30 alkyl, substituted or unsubstituted C6 to C30 aryl, $-CO-R^{17}-COOH$ (wherein $R^{17}$ is substituted or unsubstituted C1 to C30 alkylene or substituted or unsubstituted C1 to C30 alkoxylene), or a combination thereof, $R^{15}$ is $-COOH$ or $-CONHR^{18}$ (wherein $R^{18}$ is substituted or unsubstituted C1 to C30 alkyl or substituted or unsubstituted C6 to C30 aryl), $R^{16}$ is $-COOH$, or $R^{15}$ and $R^{16}$ are fused with each other to form a ring, and m is an integer of 0 to 5.

The dye-polymer composite (A) may include the above Chemical Formulae 5 to 7 each in an amount of o, p, and q mole, respectively, and the o, p, and q are in the ranges of $0 \le o \le 80$, $0 \le p \le 80$, $0 \le q \le 80$.

The repeating units represented by the above Chemical Formulae 5 to 7 may be included in an amount of about 0.1 to about 70 wt % based on the total amount (100 wt %) of the dye-polymer composite (A).

The binder resin (B) may be a cardo-based resin, an acrylic-based resin, or a combination thereof.

The photosensitive resin composition for a color filter may further include a pigment, a dye, or a combination thereof in an amount of about 0.1 to about 40 wt %.

Another embodiment of the present invention provides a color filter manufactured using the photosensitive resin composition for a color filter.

The photosensitive resin composition for a color filter can have improved heat resistance and chemical resistance, and thus can provide a color filter having high contrast ratio and high luminescence characteristics.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a definition is not otherwise provided, the term "alkyl" may refer to C1 to C30 alkyl, the term "alkenyl" may refer to C2 to C30 alkenyl, the term "cycloalkyl" may refer to C3 to C30 cycloalkyl, "heterocycloalkyl" may refer to C2 to C30 heterocycloalkyl, the term "aryl" may refer to C6 to C30 aryl, the term "heteroaryl" may refer to C3 to C30 heteroaryl, the term "arylalkyl" may refer to C7 to C30 arylalkyl, the term "alkylene" may refer to C1 to C20 alkylene, the term "arylene" may refer to C6 to C30 arylene, the term "alkylarylene" may refer to C6 to C30 alkylarylene, the term "heteroarylene" may refer to C3 to C30 heteroarylene, and the term "alkoxylene" may refer to C1 to C30 alkoxylene.

As used herein, when a specific definition is not otherwise provided, the term "substituted" may refer to one substituted with one or more of halogen (F, Cl, Br, or I), a hydroxy group, a nitro group, a cyano group, an imino group (=NH, =NR, R is a C1 to C10 alkyl group), an amino group (—NH$_2$, —NH(R'), —N(R'')(R''')), wherein R' to R''' are the same or different and are each independently C1 to C10 alkyl), an amidino group, a hydrazine or hydrazone group, a carboxyl group, substituted or unsubstituted C1 to C30 alkyl, substituted or unsubstituted C6 to C30 aryl, substituted or unsubstituted C3 to C30 cycloalkyl, substituted or unsubstituted C3 to C30 heteroaryl, substituted or unsubstituted C2 to C30 heterocycloalkyl, or a combination thereof in place of at least one hydrogen of a compound.

As used herein, when a definition is not otherwise provided, the term "hetero" may refer to one including one or more atoms including N, O, S, P, or a combination thereof in place of a carbon atom.

As used herein, "*" denotes a position linked to the same or different atom or chemical formula.

As used herein, when a definition is not otherwise provided, the term "combination thereof" refers to at least two substituents (or functional groups) bound to each other by a linking group, or at least two substituents (or functional groups) condensed to each other.

As used herein, a weight average molecular weight is an average molecular weight reduced to polystyrene that is measured using a gel permeation chromatography (GPC).

A photosensitive resin composition for a color filter according to one embodiment includes (A) a dye-polymer composite; (B) a binder resin; (C) a photopolymerizable monomer; (D) a photopolymerization initiator; and (E) a solvent.

Hereinafter, each component of the photosensitive resin composition for a color filter is described in detail.

(A) Dye-Polymer Composite

The dye-polymer composite (A) includes a repeating unit derived from a compound represented by the following Chemical Formula 1.

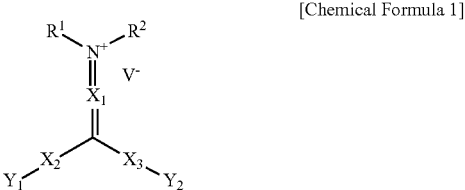

[Chemical Formula 1]

In the above Chemical Formula 1, $X_1$ is substituted or unsubstituted C3 to C30 cycloalkenylene, substituted or unsubstituted C3 to C30 heterocycloalkenylene, or a combination thereof, $X_2$ and $X_3$ are the same or different and are each independently substituted or unsubstituted C6 to C30 arylene, substituted or unsubstituted C6 to C30 alkylarylene, substituted or unsubstituted C3 to C30 heteroarylene, or a combination thereof, $Y_1$ is —NR$^3$R$^4$, —OR$^5$, or —SR$^6$, and $R^1$ to $R^6$ are the same or different and are each independently hydrogen, substituted or unsubstituted C1 to C30 alkyl, substituted or unsubstituted C3 to C30 cycloalkyl, substituted or unsubstituted C6 to C30 aryl, substituted or unsubstituted C6 to C30 alkylaryl, substituted or unsubstituted C3 to C30 heteroaryl, or a combination thereof, $Y_2$ is —NR$^{21}$R$^{22}$, —OR$^{23}$, or —SR$^{24}$, $R^{21}$ and $R^{22}$ are the same or different and are each independently hydrogen, substituted or unsubstituted C1 to C30 alkyl, substituted or unsubstituted C3 to C30 cycloalkyl, substituted or unsubstituted C6 to C30 aryl, substituted or unsubstituted C6 to C30 alkylaryl, substituted or unsubstituted C3 to C30 heteroaryl, substituted or unsubstituted (meth)acrylate, or a combination thereof, wherein at least one of $R^{21}$ and $R^{22}$ is C1 to C30 alkyl substituted with a (meth)acrylate group, C3 to C30 cycloalkyl substituted with a (meth)acrylate group, C6 to C30 aryl substituted with a (meth)acrylate group, C6 to C30 alkylaryl substituted with a (meth)acrylate group, C3 to C30 heteroaryl substituted with a (meth)acrylate group, or (meth)acrylate group, and $R^{23}$ and $R^{24}$ are the same or different and are each independently C1 to C30 alkyl substituted with a (meth)acrylate group, C3 to C30 cycloalkyl substituted with a (meth)acrylate group, C6 to C30 aryl substituted with a (meth)acrylate group, C6 to C30 alkylaryl substituted with a (meth)acrylate group, C3 to C30 heteroaryl substituted with a (meth)acrylate group, or (meth)acrylate group.

In the above Chemical Formula 1, $R^1$ to $R^6$ may be unsubstituted C1 to C20 alkyl, unsubstituted C1 to C20 cycloalkyl, unsubstituted C1 to C30 aryl, or unsubstituted C1 to C30 heteroaryl.

In the above Chemical Formula 1, at least one of $R^{21}$ and $R^{22}$; and $R^{23}$ and $R^{24}$ includes an alkenyl group, and specifically a (meth)acrylate group. That is to say, the compound represented by the above Chemical Formula 1 includes at least one (meth)acrylate group at a $Y^2$ position. The (meth) acrylate group may carry out a polymerization reaction, and through the polymerization reaction, the dye-polymer composite (A) may be prepared.

$V^-$ is a counter ion of $N^+$, for example an ion having monovalent negative charge such as $N^-(SO_2CF_3)_2$ and the like.

When the dye-polymer composite (A) including the repeating unit derived from a compound represented by the following Chemical Formula 1 is used in a photosensitive resin composition for a color filter, excellent chemical resistance and heat resistance may be ensured.

At least one of $R^{20}$ and $R^{21}$; $R^{22}$ and $R^{23}$ of the above Chemical Formula 1 may specifically include a functional group represented by the following Chemical Formula 2.

[Chemical Formula 2]

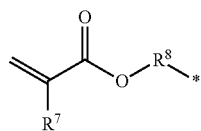

In the above Chemical Formula 2, $R^7$ is hydrogen or methyl, $R^8$ is a single bond, substituted or unsubstituted C1 to C30 alkylene, substituted or unsubstituted C6 to C30 arylene, substituted or unsubstituted C6 to C30 alkylarylene, substituted or unsubstituted C3 to C30 heteroarylene,

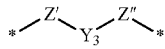

(wherein Z' and Z'' are the same or different and are each independently C1 to C30 alkylene, and $Y_3$ is —N(H)—, —S— or —O—, or a combination thereof).

The compound represented by the above Chemical Formula 1 including a functional group including a (meth)acrylate group represented by the above Chemical Formula 2 at a $Y^2$ position may carry out a polymerization reaction, and through the polymerization reaction, the dye-polymer composite (A) may be prepared.

The compound represented by the above Chemical Formula 1 may be a compound represented by the following Chemical Formula 3.

[Chemical Formula 3]

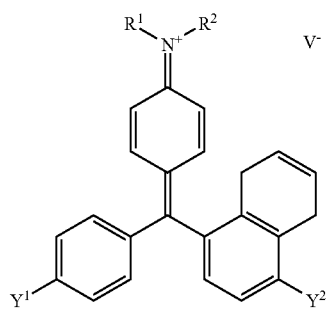

In the above Chemical Formula 3, $Y_1$, $Y_2$, $R^1$, $R^2$, and V are the same as described above. The dye-polymer composite (A) may provide excellent transmittance and heat resistance due to a repeating unit derived from the compound represented by the above Chemical Formula 3.

As another example, the compound represented by the above Chemical Formula 1 may be a compound represented by the following Chemical Formula 4.

[Chemical Formula 4]

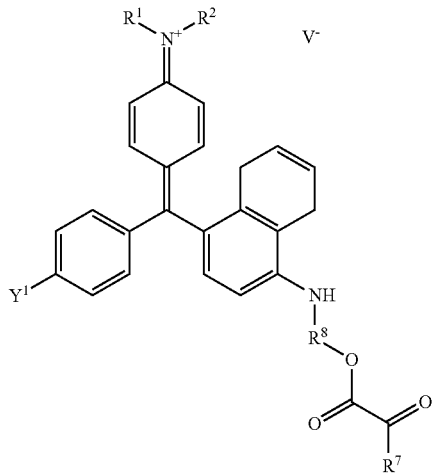

In the above Chemical Formula 4, $Y_1$, $R^1$, $R^2$, $R^7$, $R^8$, and $V^-$ are the same as described above. The dye-polymer composite (A) may provide excellent transmittance and heat resistance due to a repeating unit derived from the compound represented by the above Chemical Formula 4.

The dye-polymer composite (A) may be obtained by copolymerizing the compound represented by the above Chemical Formula 1 and other monomers copolymerizable therewith.

In this way, the dye-polymer composite (A) may have a high molecular weight by a copolymerization reaction of a dye such as the compound represented by the Chemical Formula 1 and the like with other monomers copolymerizable therewith, and thus can have minimal or no problems associated with a low molecular dye and the like, which can be extracted by water or an organic solvent, and can have improved heat resistance, chemical resistance, and the like during manufacture of a color filter.

The amount of the repeating unit derived from a compound represented by the following Chemical Formula 1 in the dye-polymer composite (A) may be adjusted according to purposes. The dye-polymer composite (A) can include the repeating unit derived from a compound represented by the above Chemical Formula 1 in an amount of about 0.1 to about 70 wt %, for example, about 1 to about 65 wt %, about 1 to about 60 wt %, about 10 to about 70 wt %, about 20 to about 70 wt %, about 30 to about 70 wt %, or about 40 to about 70 wt %, based on total amount (100 wt %) of the dye-polymer composite (A). In some embodiments, the dye-polymer composite (A) can include the repeating unit derived from a compound represented by the above Chemical Formula 1 in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the repeating unit derived from a compound represented by the above Chemical Formula 1 can be in a range from about any of the foregoing amounts to about any other of the foregoing amounts.

When the repeating unit derived from a compound represented by the above Chemical Formula 1 is included in an amount within the above range, dye precipitation due to an excessive amount of dye may not occur and excellent chemical resistance and heat resistance may be obtained.

The dye-polymer composite (A) may further include a repeating unit derived from a first ethylenic unsaturated monomer and a repeating unit derived from a second ethylenic unsaturated monomer copolymerizable therewith, as well as the repeating unit derived from a compound represented by the above Chemical Formula 1.

The first ethylenic unsaturated monomer can be an ethylenic unsaturated monomer including at least one carboxyl group. Examples of the first ethylenic unsaturated monomer may include without limitation acrylic acid, methacrylic acid, maleic acid, itaconic acid, fumaric acid, and the like, and combinations thereof.

The dye-polymer composite may include the first ethylenic unsaturated monomer in an amount of about 1 wt % to about 50 wt %, for example about 3 wt % to about 40 wt %, and as another example about 5 wt % to about 30 wt %, based on the total amount (100 wt %) of monomers used to provide the dye-polymer composite. In some embodiments, the dye-polymer composite (A) can include the first ethylenic unsaturated monomer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation alkenyl aromatic monomers, unsaturated carbonic acid ester compounds, unsaturated carbonic acid aminoalkyl ester compounds, carbonic acid vinyl ester compounds, unsaturated carbonic acid glycidyl ester compounds, vinyl cyanide compounds, unsaturated amide compounds, and the like, and combinations thereof.

Examples of the alkenyl aromatic monomer may include without limitation styrene, α-methyl styrene, vinyl toluene, vinyl benzyl methylether, and the like; examples of the unsaturated carbonic acid ester compound may include without limitation methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and the like; examples of the unsaturated carbonic acid amino alkyl ester compound may include without limitation 2-amino ethyl acrylate, 2-amino ethyl methacrylate, 2-dimethyl amino ethyl acrylate, 2-dimethyl amino ethyl methacrylate, and the like; examples of the carbonic acid vinyl ester compound may include without limitation vinyl acetate, vinyl benzoate, and the like; examples of the unsaturated carbonic acid glycidyl ester compound may include without limitation glycidyl acrylate, glycidyl methacrylate, and the like; examples of the vinyl cyanide compound may include without limitation acrylonitrile, methacrylonitrile, and the like; and examples of the unsaturated amide compound may include without limitation acrylamide, methacrylamide, and the like. The second unsaturated ethylenic unsaturated monomer may be used singularly or as a mixture of two or more.

In exemplary embodiments, the dye-polymer composite (A) may include at least one of repeating units represented by the following Chemical Formulae 5 to 7, or a combination thereof, as well as the repeating unit derived from a compound represented by the above Chemical Formula 1.

[Chemical Formula 5]

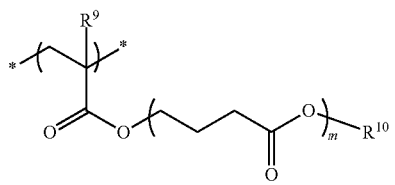

[Chemical Formula 6]

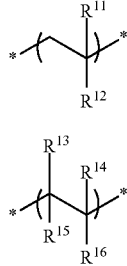

[Chemical Formula 7]

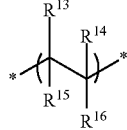

In the above Chemical Formulae 5 to 7, $R^9$, $R^{10}$, $R^{11}$, $R^{13}$, and $R^{14}$ are the same or different and are each independently hydrogen, substituted or unsubstituted C1 to C30 alkyl, substituted or unsubstituted C6 to C30 aryl, substituted or unsubstituted C6 to C30 alkylaryl, or a combination thereof, $R^{12}$ is substituted or unsubstituted C1 to C30 alkyl, substituted or unsubstituted C6 to C30 aryl, —CO—$R^{17}$—COOH (wherein $R^{17}$ is substituted or unsubstituted C1 to C30 alkylene or substituted or unsubstituted C1 to C30 alkoxylene), or a combination thereof, $R^{15}$ is —COOH or —CONH$R^{18}$ (wherein $R^{18}$ is substituted or unsubstituted C1 to C30 alkyl or substituted or unsubstituted C6 to C30 aryl), $R^{16}$ is —COOH, or $R^{15}$ and $R^{16}$ are fused with each other to form a ring, and m is an integer of 0 to 5.

When the dye-polymer composite (A) includes repeating units represented by the above Chemical Formulae 5 to 7, each repeating unit is included in an amount of o, p, and q moles, respectively, and o, p, and q may be in the following ranges: 0≤o≤80, 0≤p≤80, and 0≤o≤80, for example 0≤o≤50, 0≤p≤50, and 0≤q≤50. When the repeating units represented by the above Chemical Formulae 5 to 7 are present in amounts within the above mole ratio ranges, appropriate developability, heat resistance, and chemical resistance may be ensured.

The dye-polymer composite (A) may include repeating units represented by the above Chemical Formulae 5 to 7 in an amount of about 0.1 to about 70 wt %, for example about 10 to about 60 wt %, about 20 to about 50 wt %, or about 30 to about 40 wt %, based on total amount (100 wt %) of the dye-polymer composite (A). In some embodiments, the dye-polymer composite (A) can include repeating units represented by the above Chemical Formulae 5 to 7 in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of repeating units represented by the above Chemical Formulae 5 to 7 can be in a range from about any of the foregoing amounts to about any other of the foregoing amounts.

When the repeating units represented by the above Chemical Formulae 5 to 7 are included in amounts within the above range, a color filter having improved chemical resistance, and pattern stability and light transmittance characteristics may be provided.

The dye-polymer composite (A) may have a weight average molecular weight (Mw) of about 1,000 to about 500,000 g/mol, for example, about 5,000 to about 50,000 g/mol, and as another example about 7,000 to about 20,000 g/mol. When the dye-polymer composite (A) has too large weight average molecular weight (Mw), it can be hard to synthesize the dye-polymer composite, and it is possible that the compound represented by Chemical Formula 1 may be precipitated.

The dye-polymer composite (A) may have an acid value of about 0 to about 300 mg KOH/g, for example about 10 to about 200 mg KOH/g. When the weight average molecular weight and acid value of the dye-polymer composite (A) falls within the above range, excellent developability may be obtained.

The photosensitive resin composition may include the dye-polymer composite (A) in an amount of about 0.5 wt % to about 50 wt %, for example about 0.5 to about 40 wt %, about 0.5 to about 30 wt %, about 0.5 to about 20 wt %, or about 0.5 to about 10 wt %, based on the total amount (100 wt %) of the photosensitive resin composition for a color filter. In some embodiments, the photosensitive resin composition may include the dye-polymer composite (A) in an amount of about 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the dye-polymer composite (A) can be in a range from about any of the foregoing amounts to about any other of the foregoing amounts.

When the dye-polymer composite (A) is included in an amount within the above range, developability for an alkali developing solution can be improved, surface roughness can be reduced due to excellent cross-linking, a pattern may not be pulled out due to improved chemical resistance, and the color may not change even in an organic solvent.

The extent of photocross-linking (cross-linking extent) caused by the dye-polymer composite (A) may be determined based on the composition ratio of a photopolymerizable monomer and a photopolymerization initiator, which is described below, and accordingly the cross-linking extent may be controlled by adjusting the composition ratio of the photopolymerizable monomer and the photopolymerization initiator.

(B) Binder Resin

The binder resin may be a cardo-based resin, an acrylic-based resin, or a combination thereof that may be used singularly or in a mixture thereof.

The cardo-based resin may be a compound including a repeating unit represented by the following Chemical Formula 8.

[Chemical Formula 8]

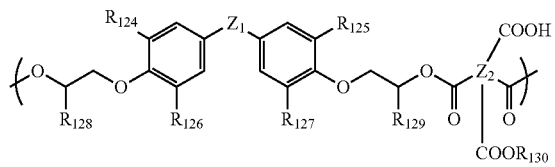

In the above Chemical Formula 8, $R_{124}$ to $R_{127}$ are the same or different and are each independently hydrogen, halogen, or substituted or unsubstituted C1 to C20 alkyl, $R_{128}$ and $R_{129}$ are the same or different and are each independently hydrogen or $CH_2OR_a$ (wherein $R_a$ is a vinyl group, an acrylic group, or a methacrylic group), each $R_{130}$ is the same or different and is each independently hydrogen, substituted or unsubstituted C1 to C20 alkyl, substituted or unsubstituted C2 to C20 alkenyl, acrylic group or methacrylic group, each $Z_1$ is the same or different and is each independently a single bond, O, CO, $SO_2$, $CR_bR_c$, $SiR_dR_e$ (wherein $R_b$ to $R_e$ are the same or different and are each independently hydrogen or substituted or unsubstituted C1 to C20 alkyl), or compound represented by the following Chemical Formulae 9-1 to 9-11, and each $Z_2$ is the same or different and is each independently an acid anhydride residual group or an acid dianhydride residual group.

[Chemical Formula 9-1]

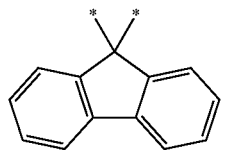

[Chemical Formula 9-2]

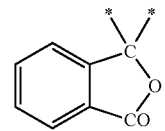

[Chemical Formula 9-3]

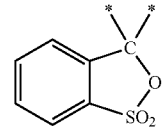

[Chemical Formula 9-4]

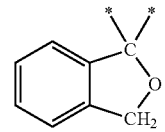

[Chemical Formula 9-5]

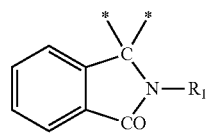

In the above Chemical Formula 9-5, $R_f$ is hydrogen, ethyl, $C_2H_4Cl$, $C_2H_4OH$, $CH_2CH=CH_2$, or phenyl.

[Chemical Formula 9-6]

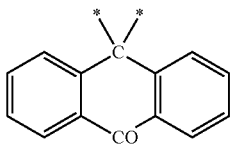

[Chemical Formula 9-7]

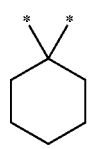

[Chemical Formula 9-8]

[Chemical Formula 9-9]

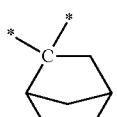

[Chemical Formula 9-10]

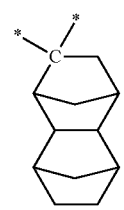

[Chemical Formula 9-11]

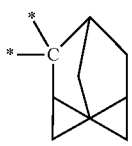

The cardo-based resin may be obtained by reacting a compound represented by the following Chemical Formula 10 with tetracarboxylic acid dianhydride.

[Chemical Formula 10]

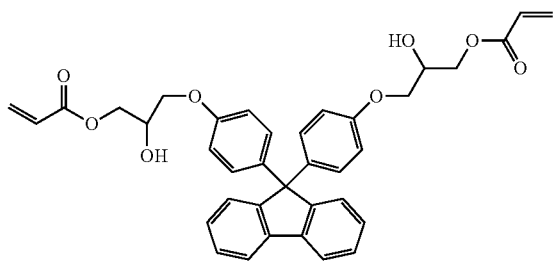

The tetracarboxylic acid dianhydride may be an aromatic tetracarboxylic acid dianhydride. Examples of the aromatic tetracarboxylic acid dianhydride may include without limitation pyromellitic dianhydride, 3,3',4,4'-biphenyltetracarboxylic acid dianhydride, 2,3,3',4-biphenyltetracarboxylic acid dianhydride, 2,2',3,3'-biphenyltetracarboxylic acid dianhydride, 3,3',4,4'-benzophenonetetracarboxylic acid dianhydride, 3,3',4,4'-biphenylethertetracarboxylic acid dianhydride, 3,3',4,4'-diphenylsulfonetetracarboxylic acid dianhydride, 1,2,3,4-cyclopentanetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6-pyridinetetracarboxylic acid dianhydride, 3,4,9,10-perylenetetracarboxylic acid dianhydride, 2,2-bis(3,4-dicarboxylphenyl)hexafluoropropane dianhydride, and the like, and combinations thereof.

The cardo-based resin may have a weight average molecular weight of about 1,000 to about 20,000 g/mol, for example about 3,000 to about 10,000 g/mol. When the cardo-based resin has a weight average molecular weight within the above range, excellent pattern properties and developability during manufacture of a color filter may be obtained.

The acrylic-based resin is a copolymer of a first ethylenic unsaturated monomer and a second ethylenic unsaturated monomer that is copolymerizable therewith, and is a resin including at least one acrylic-based repeating unit.

The first ethylenic unsaturated monomer is an ethylenic unsaturated monomer including at least one carboxyl group. Examples of the monomer include without limitation acrylic acid, methacrylic acid, maleic acid, itaconic acid, fumaric acid, and the like and combinations thereof.

The acrylic-based resin may include the first ethylenic unsaturated monomer in an amount ranging from about 5 to about 50 wt %, for example from about 10 to about 40 wt %, based on the total amount (100 wt %) of the acrylic-based resin. In some embodiments, the acrylic-based resin may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyl toluene, vinylbenzylmethylether and the like; unsaturated carboxylate ester compounds such as methyl(meth)acrylate, ethyl(meth)acrylate, butyl(meth)acrylate, 2-hydroxyethyl(meth)acrylate, 2-hydroxybutyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate, and the like; vinyl cyanide compounds such as (meth)acrylonitrile and the like; unsaturated amide compounds such as (meth)acrylamide, and the like; and the like, and may be used singularly or as a mixture of two or more.

Specific examples of the acrylic-based resin may include without limitation a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like. These may be used singularly or as a mixture of two or more.

The acrylic-based resin may have a weight average molecular weight of about 3,000 to about 150,000 g/mol, for example about 5,000 to about 50,000 g/mol, and as another example about 2,000 to about 30,000 g/mol. When the acrylic-based resin has a weight average molecular weight within the above range, the photosensitive resin composition can have excellent physical and chemical properties, can have an appropriate viscosity, and can have an improved close contacting (adhesive) property during manufacture of a color filter.

The acrylic-based resin may have an acid value ranging from about 15 to about 60 mgKOH/g, for example about 20 to about 50 mgKOH/g. When the acrylic-based resin has an acid value within the above range, excellent pixel resolution may be obtained.

The cardo-based resin and the acrylic-based resin may be used in a weight ratio of about 1:99 to about 99:1.

The combination of the cardo-based resin and the acrylic-based resin may include the cardo-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the cardo-based resin can be in a range from about any of the foregoing amounts to about any other of the foregoing amounts.

The combination of the cardo-based resin and the acrylic-based resin may include the acrylic-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the acrylic-based resin can be in a range from about any of the foregoing amounts to about any other of the foregoing amounts.

Within the above weight ratio range, excellent developability may be maintained and undercut generation of a color filter pattern may be prevented while taper characteristics can be improved.

The photosensitive resin composition may include the binder resin in an amount of about 0.5 to about 20 wt %, for example about 0.5 to about 10 wt %, based on the total amount (100 wt %) of the photosensitive resin composition. In some embodiments, the photosensitive resin composition may include the binder resin in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the binder resin can be in a range from about any of the foregoing amounts to about any other of the foregoing amounts.

When the binder resin is included in an amount within the above range, the photosensitive resin composition can have an appropriate viscosity and can have improved pattern properties, processibility and developability during manufacture of a color filter.

(C) Photopolymerizable Monomer

The photopolymerizable monomer may be any photopolymerizable monomer that may be included in a photosensitive resin composition.

Examples of the photopolymerizable monomer may include without limitation ethylene glycol di(meth)acrylate, diethylene glycol di(meth)acrylate, triethylene glycol di(meth)acrylate, propylene glycol di(meth)acrylate, 1,4-butanediol di(meth)acrylate, 1,6-hexanediol di(meth)acrylate, neopentylglycol di(meth)acrylate, pentaerythritol di(meth) acrylate, pentaerythritol tri(meth)acrylate, pentaerythritol tetra(meth)acrylate, pentaerythritol penta(meth)acrylate, pentaerythritol hexa(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, trimethylolpropane tri(meth)acrylate, novolacepoxy (meth)acrylate, a dipentaerythritol penta(meth)acrylate derivative including a carboxyl group, ethyleneoxide glycerinetrimethylolpropanetri(meth)acrylate, propyleneoxide glycerinetri(meth)acrylate, and the like, and combinations thereof.

The photopolymerizable monomer may be a monomer including a carboxyl group, since they tend to react with a cyclic ether and thereby improve solvent-resistance. Examples of the photopolymerizable monomer or oligomer including a carboxyl group may include without limitation esters of hydroxyl group-containing (meth)acrylate and carboxylic polyacid; esters of hydroxyl group-containing (meth)acrylate and carboxylic polyacid anhydride, and the like, and combinations thereof.

Examples of the hydroxyl group-containing (meth)acrylate can include without limitation trimethylolpropane di(meth)acrylate, glycerine di(meth)acrylate, pentaerythritol tri(meth)acrylate, dipentaerythritol penta(meth)acrylate, and the like, and combinations thereof.

Examples of the carboxylic polyacid may include without limitation aromatic carboxylic polyacids such as phthalic acid, 3,4-dimethylphthalic acid, isophthalic acid, terephthalic acid, pyromellitic acid, trimellitic acid, 1,4,5,8-naphthalenetetracarboxylic acid, 3,3',4,4'-benzophenonetetracarboxylic acid, and the like; aliphatic carboxylic polyacids such as succinic acid, glutaric acid, sebacic acid, 1,2,3,4-butanetetracarboxylic acid, maleic acid, fumaric acid, itaconic acid, and the like; alicyclic carboxylic polyacids such as hexahydrophthalic acid, 3,4-dimethyltetrahydrophthalic acid, hexahydroisophthalic acid, hexahydroterephthalic acid, 1,2,4-cyclopentanetricarboxylic acid, 1,2,4-cyclohexanetricarboxylic acid, cyclopentanetetracarboxylic acid, 1,2,4,5-cyclohexane, tetracarboxylic acid, and the like; and the like and combinations thereof.

Examples of the carboxylic polyacid anhydride may include without limitation aromatic carboxylic polyacid anhydrides such as phthalic anhydride, pyromellitic anhydride, trimellitic anhydride, 3,3',4,4'-benzophenone tetracarboxylic acid 2 anhydride, and the like; aliphatic carboxylic polyacid anhydrides such as itaconic anhydride, succinic anhydride, citraconic anhydride, dodecenylsuccinic anhydride, tricarbalyl anhydride, maleic anhydride, 1,2,3,4-butanetetracarboxylic acid 2 anhydride, and the like; alicyclic carboxylic polyacid anhydrides such as hexahydrophthalic acid, 3,4-dimethyl tetrahydrophthalic anhydride, 1,2,4-cyclopentane tricarboxylic acid anhydride, 1,2,4-cyclohexane tricarboxylic acid anhydride, cyclopentane tetracarboxylic acid 2 anhydride, 1,2,4,5-cyclohexane tetracarboxylic acid 2 anhydride, himic anhydride, nadic acid anhydride, and the like; carboxylic acid anhydrides including an ester group such as ethylene glycol bistrimellitate acid, glycerine tristrimelliatate anhydride, and the like; and the like, and combinations thereof.

Specific examples of the monomer or oligomer including a carboxyl group may include without limitation a phthalic acid ester of trimethylol propane di(meth)acrylate, a succinic acid ester of glycerine di(meth)acrylate, a phthalic acid ester of pentaerythritol tri(meth)acrylate, a succinic acid ester of pentaerythritol triacrylate, a phthalic acid ester of dipentaerythritol penta(meth)acrylate, a succinic acid ester of dipentaerythritol penta(meth)acrylate, and the like and combinations thereof.

The photosensitive resin composition may include the photopolymerizable monomer in an amount of about 0.5 wt % to about 20 wt % based on the total amount (100 wt %) of the photosensitive resin composition for a color filter. In some embodiments, the photosensitive resin composition may include the photopolymerizable monomer in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerizable monomer can be in a range from about any of the foregoing amounts to about any other of the foregoing amounts.

When the amount of the photopolymerizable monomer is within the above range, a pattern can be formed with clear edges and developability in an alkali developing solution can be excellent.

(D) Photopolymerization Initiator

Examples of the photopolymerization initiator may include without limitation triazine-based compounds, acetophenone-based compounds, biimidazole-based compounds, benzoin-based compounds, benzophenone-based compounds, thioxanthone-based compounds, oxime-based compounds, and the like, and combinations thereof.

Examples of the triazine-based compound may include without limitation 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine, 2,4-bis(trichloromethyl)-6-piperonyl)-1,3,5-triazine, 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphtho 1-yl)-4,6-bis(trichloro methyl)-s-triazine, 2-(4-methoxy naphtho 1-yl)-4,6-bis(trichloro methyl)-s-triazine, 2-4-bis(trichloromethyl)-6-piperonyl-s-triazine, 2-4-bis(trichloromethyl)-6-(4-methoxystyryl)-s-triazine, and the like, and combinations thereof. In exemplary embodiments, 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, and/or 2,4-bis(trichloromethyl)-6-piperonyl-1,3,5-triazine may be used, for example, 2,4-bis(trichloromethyl)-6-piperonyl-1,3,5-triazine, and the like may be used.

Examples of the acetophenone-based compound may include without limitation diethoxyacetophenone, 2-methyl-2-morpholino-1-(4-methylthiophenyl)propan-1-one, 2-hydroxy-2-methyl-1-phenylpropan-1-one, benzyldimethylketal, 2-hydroxy-2-methyl-1-[4-(2-hydroxyethoxy)phenyl]propan-1-one, 1-hydroxycyclohexylphenylketone, 2-benzyl-2-dimethylamino-1-(4-morpholinophenyl)butan-1-one, 2-(4-methylbenzyl)-2-dimethylamino-1-(4-morpholinophenyl)butan-1-one, 2-hydroxy-2-methyl-1-[4-(1-methylvinyl)phenyl]propan-1-one, and the like, and combinations thereof. In exemplary embodiments, 2-methyl-2-morpholino-1-(4-methylthiophenyl)propan-1-one, 2-benzyl-2-dimethylamino-1-(4-morpholinophenyl)butan-1-one and/or 2-(4-methylbenzyl)-2-dimethyl amino-1-(4-morpholinophenyl)butan-1-one may be used, for example, 2-benzyl-2-dimethylamino-1-(4-morpholinophenyl)butan-1-one and/or 2-(4-methylbenzyl)-2-dimethylamino-1-(4-morpholinophenyl)butan-1-one may be used.

Examples of the biimidazole-based compound may include without limitation 2,2'-bis(2-chlorophenyl)-4,4',5,5'-tetraphenylbiimidazoles, 2,2'-bis(2-chlorophenyl)-4,4',5,5'-tetra(4-carboethoxyphenyl)biimidazoles, 2,2',-bis(2-chlorophenyl)-4,4',5,5'-tetra(4-bromophenyl)biimidazoles, 2,2'-bis(2-chlorophenyl)-4,4',5,5'-tetra(2,4-dichlorophenyl)biimidazoles, 2,2'-bis(2-bromophenyl)-4,4',5,5'-tetraphenylbiimidazoles, 2,2'-bis(2,4-dichlorophenyl)-4,4',5,5'-tetraphenylbiimidazoles, 2,2'-bis(2-chlorophenyl)-4,4',5,5'-tetra(m-methoxyphenyl)biimidazoles, 2,2'-bis(2,3-dichlorophenyl)-4,4',5,5'-tetraphenylbiimidazoles, 2,2'-bis(2,6-dichlorophenyl)-4,4',5,5'-tetraphenylbiimidazoles, 2,2'-bis(2-nitrophenyl)-4,4',5,5'-tetraphenylbiimidazoles, 2,2'-bis(2-methylphenyl)-4,4',5,5'-tetraphenylbiimidazoles, and the like, and combinations thereof. In exemplary embodiments, 2,2'-bis(2-chlorophenyl)-4,4',5,5'-tetraphenylbiimidazoles and/or 2,2'-bis(2,3-dichlorophenyl)-4,4',5,5'-tetraphenylbiimidazoles may be used.

Examples of the benzoin-based compound may include without limitation benzoin, benzoin methylether, benzoin ethylether, benzoin isopropylether, benzoin isobutylether, benzyldimethylketal, and the like, and combinations thereof.

Examples of the benzophenone-based compound may include without limitation benzophenone, benzoyl benzoic acid, o-benzoyl benzoic acid methyl, 4-phenyl benzophenone, hydroxy benzophenone, acrylated benzophenone, 3,3'-dimethyl-2-methoxy benzophenone, 4,4'-dichloro benzophenone, 4,4'-bis(dimethylamino)benzophenone, 4,4'-bis(diethylamino)benzophenone, 4-benzoyl-4'-methyldiphenylsulfide, 3,3',4,4'-tetra(tert-butylperoxycarbonyl)benzophenone, 2,4,6-trimethylbenzophenone, and the like, and combinations thereof.

Examples of the thioxanthone-based compound may include without limitation thioxanthone, 2-methyl thioxanthone, 2-isopropyl thioxanthone, 4-isopropyl thioxanthone, 2,4-diethyl thioxanthone, 2,4-diisopropyl thioxanthone, 2-chloro thioxanthone, 1-chloro-4-propoxythioxanone, and the like, and combinations thereof.

Examples of the oxime-based compound may include without limitation O-acyloxime-based compounds, 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like, and combinations thereof. Examples of the O-acyloxime-based compound may include without limitation 1-(4-phenylsulfanyl phenyl)-butane-1,2-dione 2-oxime-O-benzoate, 1-(4-phenylsulfanyl phenyl)-octane-1,2-dione 2-oxime-O-benzoate, 1-(4-phenylsulfanyl phenyl)-octan-1-oneoxime-O-acetate, and 1-(4-phenylsulfanyl phenyl)-butan-1-oneoxime-O-acetate, and the like, and combinations thereof.

A carbazole-based compound, a diketone compound, a sulfonium borate-based compound, a diazo-based compound, and the like, and combinations thereof, may be used instead or in addition to the above photopolymerization initiators.

The photopolymerization initiator absorbs light and is excited and then transmits energy, and it may be used with a photo-sensitizer causing a chemical reaction.

The photosensitive resin composition may include the photopolymerization initiator in an amount of about 0.1 wt % to about 10 wt % based on the total amount (100 wt %) of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, it may bring about sufficient photopolymerization in the patterning process, with minimal or no deterioration of transmittance due to residual non-reacting initiator remnants.

The extent of cross-linking extent caused by the dye-polymer composite (A) may be determined based on the composition ratio of the photopolymerizable monomer (C) and the photopolymerization initiator (D), and accordingly the cross-linking extent may be controlled by adjusting the composition ratio of the photopolymerizable monomer (C) and the photopolymerization initiator (D).

(E) Solvent

The solvent has compatibility with the dye-polymer composite (A) and other component materials but does not have a reaction therewith Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy acetic acid alkyl esters such as oxy methyl acetate, oxy ethyl acetate, oxy butyl acetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate and the like; monooxy monocarboxylic acid alkyl esters of 2-alkoxy-2-methyl propionic acid alkyl such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, the like; ketone acid esters such as ethyl pyruvate, and the like, and combinations thereof and/or a solvent having a high boiling point such as but not limited to N-methylformamide, N,N-dimethylformamide, N-methylformanilide, N-methylacetamide, N,N-dimethylacetamide, N-methylpyrrolidone, dimethylsulfoxide, benzylethylether, dihexylether, acetyl acetone, isophorone, caproic acid, caprylic acid, 1-octanol, 1-nonanol, benzylalcohol, benzyl acetate, ethyl benzoate, diethyl oxalate, diethyl maleate, γ-butyrolactone, carbonate ethylene, carbonate propylene, phenyl cellosolve acetate, and the like, and combinations thereof.

In exemplary embodiments, considering compatibility and reactivity, examples of the solvents may include without limitation glycol ethers such as ethylene glycol monoethyl ether, and the like; ethylene glycol alkylether acetates such as ethyl cellosolve acetate, and the like; esters such as 2-hydroxy ethyl propionate, and the like; diethylene glycols such as diethylene glycol monomethylether, and the like; propylene glycol alkylether acetates such as propylene glycol methylether acetate, propylene glycol propylether acetate, and the like, and combinations thereof, and considering solubility of the dye, cyclohexanone, and may be included in an amount of about 10 parts by weight to about 80 parts by weight based on about 100 parts by weight of the solvent. These solvents may be used singularly or as a mixture of two or more.

The photosensitive resin composition may include the solvent in a balance amount, for example, in an amount ranging from about 20 to about 90 wt %, based on the total amount (100 wt %) of the photosensitive resin composition for a color filter. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition can have improved coating properties, and can provide excellent flatness at a thickness of about 1 μm or more.

(F) Pigment and/or Dye

The photosensitive resin composition may further include a pigment, a dye, or a combination thereof as a colorant in addition to the dye-polymer composite (A) to realize color characteristics. In particular, when the pigment and the dye are used as a hybrid type, a problem caused by excessively using a pigment, for example, lighting sensitivity deterioration, pattern-tearing off, pattern linearity, residue, and the like may be improved.

The pigment may have colors of red, green, blue, yellow, violet and the like. Examples of the pigment may include without limitation condensed polycyclic pigments such as anthraquinone-based pigments, perylene-based pigments and the like, phthalocyanine-based pigments, azo-based pigments, and the like. They may be used as singularly or in combination of two or more. A combination of two or more pigments may be used to adjust maximum absorption wavelength, cross point, crosstalk, and the like.

The pigment may be included in a photosensitive resin composition for a color filter as a pigment dispersion solution.

In addition, the pigment may include a dispersing agent, so that the pigment component can be uniformly dispersed. Examples of the dispersing agent may include without limitation nonionic, negative ionic, and/or positive ionic dispersing agents, for example, polyalkylene glycols and esters thereof, polyoxyalkylenes, polyhydric alcohol ester alkylene oxide additives, alcohol alkyleneoxide additives, sulfonic acid esters, sulfonic acid salts, carboxylic acidesters, carboxylic acid salts, alkylamidealkyleneoxide additives, alkylamines, and the like. These dispersing agents may be used singularly or in a combination of two or more.

In addition, a carboxyl-containing acrylic-based resin as well as the dispersing agent may be additionally used in order to improve pixel patterning properties as well as stability of a pigment dispersion solution.

The pigment can have a primary particle diameter ranging from about 10 to about 80 nm, for example about 10 to about 70 nm. When the pigment has a primary particle diameter within the above range, it can have excellent stability in a dispersion solution but may not deteriorate resolution of pixels.

Examples of the dye may include without limitation anthraquinone-based compounds, cyanine-based compounds, mesocyanine-based compounds, azaporphyrin-based compounds, phthalocyanine-based compounds, pyrrolopyrrole-based compounds, diazo-based compounds, carbonium-based compounds, acridine-based compounds, thiazole-based compounds, quinimine-based compounds, methine-based compounds, quinoline-based compounds, and the like, and combinations thereof.

When the dispersion including the pigment and dye is used, the pigment and dye may be present at a ratio of about 1:9 to about 9:1. Within the above range, the composition may realize high luminance and contrast ratio and realize desired color characteristics.

The photosensitive resin composition may include the pigment and/or dye in an amount of about 0.1 to about 40 wt % based on the total amount (100 wt %) of the photosensitive resin composition for a color filter. In some embodiments, the photosensitive resin composition may include the pigment and/or dye in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the pigment and/or dye can be in a range from about any of the foregoing amounts to about any other of the foregoing amounts.

When the pigment and/or dye is used in an amount within the above ranges, the composition may have appropriate coloring effects and developability.

(G) Other Additive(s)

The photosensitive resin composition for a color filter according to the present invention may further include one or more other additives. Examples of the additives may include without limitation dispersing agents as described above other than the (A) to (D) components, so that a component such as the pigment and/or dye and the like may be uniformly dispersed in a solvent (E).

Examples of the dispersing agent may include without limitation polyalkylene glycols and esters thereof, polyoxyalkylenes, polyhydric alcohol ester alkylene oxide addition products, alcohol alkylene oxide addition products, sulfonate esters, sulfonate salts, carboxylic acid esters, carboxylate salts, alkyl amide alkylene oxide addition products, alkylamines, and the like. These may be used singularly or in a mixture of two or more.

The dispersing agent may be included in an amount of about 10 to about 20 parts by weight based on about 100 parts by weight of the pigment.

The photosensitive resin composition for a color filter may further include a coating-improving agent such as a silicon-based agent, a fluorine-based agent, and the like, and combinations thereof to improve coating and defoaming properties if necessary, an adherence improving agent to improve adherence to a substrate, and the like.

The coating-improving agent, the adherence-improving agent, and the like may be included in an amount of about 0.01 to about 1 wt % based on total amount (100 wt %) of the photosensitive resin composition.

The photosensitive resin composition for a color filter may further include other additives such as but not limited to epoxy compounds; malonic acid; 3-amino-1,2-propanediol; silane-based coupling agents with a vinyl group and/or a (meth)acryloxy group; leveling agents; silicon-based surfactants; fluorine-based surfactants; radical polymerization initiators, and the like, and combinations thereof. The additional additives can prevent a stain or a spot during the coating and generation of a residue due to non-development and can control leveling. The amounts of the additives may be adjusted according to desired properties and can be readily determined by the skilled artisan.

Examples of the epoxy compound may include without limitation phenol novolac epoxy resins, tetra methyl bi-phenyl epoxy resins, bisphenol A epoxy resins, alicyclic epoxy resins, ortho-cresol novolac resins, and the like, and combinations thereof. The epoxy compound may be included in an amount ranging from about 0.01 wt % to about 10 wt % based the total amount (100 wt %) of the photosensitive resin composition for a color filter. When the epoxy compound is used in an amount within the above range, storage and process margin may be improved.

Examples of the silane-based coupling agent may include without limitation vinyl trimethoxysilane, vinyl tris(2-methoxyethoxysilane), 3-glycidoxypropyl trimethoxysilane, 2-(3, 4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like, and combinations thereof.

The silane-based coupling agent may be included in an amount ranging from about 0.01 wt % to about 2 wt % based on the total weight (100 wt %) of the photosensitive resin composition for a color filter. When the silane-based coupling agent is used in an amount within the above range, adherence, storage stability, and coating properties may be improved.

The silicon-based surfactant may include a surfactant including a siloxane bond, and the like. Examples of the silicon-based surfactant may include without limitation DC3PA, SH7PA, DC11PA, SH21PA, SH28PA, 29SHPA, and SH30PA of TORAY SILICONE CO., LTD.; polyester-modified silicone oil, SH8400 of TORAY SILICONE CO., LTD; KP321, KP322, KP323, KP324, KP326, KP340, and GF of SHINETSU SILICONE CO., LTD.; TSF4445, TSF4446, TSF4452, and TSF4460 of TOSHIBA SILICONE CO., LTD.; and the like and combinations thereof.

The fluorine-based surfactant may be a surfactant having a fluorocarbon backbone, and the like. Examples of the fluorine-based surfactant may include without limitation FULORAD FC430, and FULORAD FC431 of SUMITOMO 3M CO., LTD.; MEGAFACE F142D, MEGAFACE F171, MEGAFACE F172, MEGAFACE F173, MEGAFACE F177, MEGAFACE F183, MEGAFACE F470, MEGAFACE F475, MEGAFACE R30 of DAINIPPON INK KAGAKU KOGYO CO., LTD.; EFTOP EF301, EFTOP EF303, EFTOP EF351, and EFTOP EF352 of TOCHEM RODUCTS, CO., LTD.; SURFLON S381, SURFLON S382, SURFLON SC101, and SURFLON SC105 of ASAHI GLASS CO., LTD.; E5844 of DIKIN Finechemical Laboratory; and the like, and combinations thereof.

The silicon-based surfactant and fluorine-based surfactant may be used singularly or as a mixture of two or more.

According to another embodiment of the present invention, a color filter manufactured using the photosensitive resin composition for a color filter is provided.

The color filter may be applicable to various electronic devices such as a liquid crystal display device, an organic light emitting diode, an image sensor, and the like.

The color filter may be provided by coating the photosensitive resin composition on a substrate followed by patterning. The patterning may be performed by exposing and developing, wherein the exposing may be performed by radiating an UV ray, an electron beam, or an X ray having, for example about 190 nm to about 450 nm, for example about 200 nm to about 400 nm.

The following examples illustrate the present invention in more detail. However, it is understood that the present invention is not limited by these examples.

Synthesis Examples 1 to 3

Synthesis of Dye-Polymer Composite

A monomer represented by the following Chemical Formula 11, benzyl methacrylate, methacrylic acid, methylmethacrylate, and N-benzylmaleimide in a weight ratio provided in the following Table 1 are put in a flask equipped with a condensing pipe and an agitator, and 6 parts by weight of 2,2'-azobis (2,4-dimethylvaleronitrile) as an initiator is added thereto based on 100 parts by weight of the total weight of the monomers. Subsequently, 300 parts by weight of propylene glycol monomethyl ether acetate (PGMEA, a solvent) are added thereto based on 100 parts by weight of the total weight of the initiator and the monomers, and the mixture is slowly agitated under a nitrogen atmosphere. The reaction solution is heated up to 90° C. and agitated for 10 hours, obtaining a dye-polymer composite (A) solution.

The dye-polymer composite (A) solution includes a solid in a concentration of 20 wt %, and the weight average molecular weight of the dye-polymer composite (A) is provided in Table 1. Herein, the weight average molecular weight is an average molecular weight reduced to polystyrene, which is measured by using gel permeation chromatography (GPC).

Comparative Synthesis Example 1

Synthesis of Copolymer

A copolymer solution is prepared according to the same method as Synthesis Example 1 except for using no monomer represented by Chemical Formula 11. The acrylic-based copolymer solution according to Comparative Synthesis Example 1 has a solid concentration of 20 wt % and a weight average molecular weight as provided in Table 1.

Comparative Synthesis Example 2

Synthesis of Dye-polymer Composite

A dye-polymer composite is prepared according to the same method as Synthesis Example 1 except for using no monomer represented by the following Chemical Formula 12 instead of the monomer represented by Chemical Formula 11.

[Chemical Formula 11]

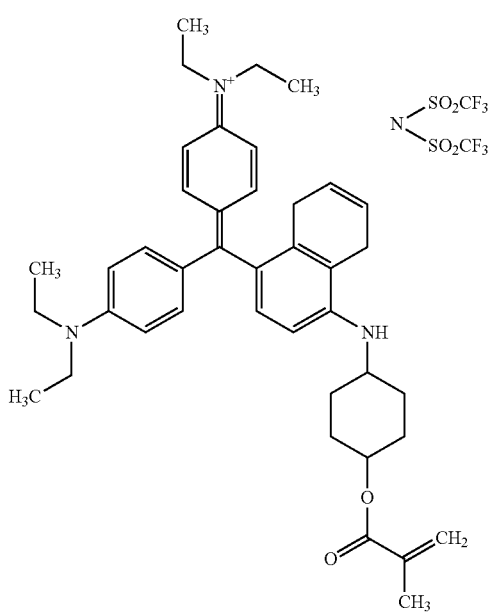

[Chemical Formula 12]

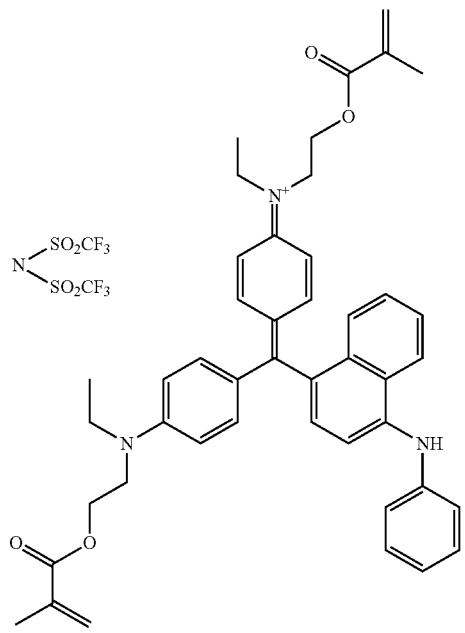

TABLE 1

(unit: wt %)

|  | Synthesis Example 1 | Synthesis Example 2 | Synthesis Example 3 | Comparative Synthesis Example 1 | Comparative Synthesis Example 2 |
|---|---|---|---|---|---|
| Chemical Formula 11 | 60 | 55 | 50 | — | — |
| Chemical Formula 12 | — | — | — | — | 60 |
| Benzyl methacrylate | 10 | 15 | 10 | 45 | 10 |
| Methacrylic acid | 15 | 15 | 15 | 15 | 15 |
| Methyl methacrylate | 5 | 5 | 15 | 25 | 5 |
| N-benzylmaleimide | 10 | 10 | 10 | 15 | 10 |
| Weight average molecular weight (Mw) | 9800 | 11500 | 8700 | 16000 | 5500 |

Preparation of Photosensitive Resin Composition for Color Filter

Examples 1 to 3

A photosensitive resin composition is prepared by using components provided in the following Table 2. First of all, a photopolymerization initiator is dissolved in a solvent, and the solution is agitated at room temperature for 2 hours. Subsequently, a binder resin and a photopolymerizable monomer are added to each dye-polymer composite polymerized in Synthesis Examples 1 to 3, and each mixture is agitated at room temperature for 2 hours, preparing photosensitive resin compositions for a color filter according to the present invention. The compositions are three times filtered to remove impurities.

TABLE 2

| Composition | Amount [g] |
|---|---|
| (A) Dye-polymer composite (Copolymers polymerized in Synthesis Examples 1 to 3) | 3.0 |
| (B) Binder resin | |
| Acryl-based polymer (Wako Pure Chemical Industries Ltd., Japan, CF-6100) | 6.0 |
| Cardo-based polymer (NSCC, V259ME) | 6.0 |
| (C) Photopolymerizable monomer | |
| Polyurethaneacrylate (Hannong Chemicals Inc., HS602) | 2.8 |
| Dendritic acrylate (Shin Nakamura Chemical Co., Ltd., V1000) | 2.8 |
| (D) Photopolymerization initiator IGACURE OXE02 (Ciba Specialty Chemicals) | 1.3 |
| (E) Solvent PGMEA | 78.0 |
| (F) Additive F-554 (DIC Co., Ltd., fluorine-based surfactant) | 0.1 |

Comparative Example 1

A photosensitive composition for a color filter is prepared according to the same method as Examples 1 to 3 by using the dye-polymer composite obtained in Comparative Synthesis Example 1 and components provided in the following Table 3.

Comparative Example 2

A photosensitive composition for a color filter is prepared according to the same method as Comparative Example 1 except for using the dye-polymer composite obtained according to Comparative Synthesis Example 2.

TABLE 3

| Composition | Amount [g] |
|---|---|
| (A) Dye-polymer composite (Copolymer prepared in Comparative Synthesis Example1 or 2) | 24.0 |
| (B) Photopolymerizable monomer dipentaerythritol hexaacrylate (DPHA) | 5.0 |
| (C) Photopolymerization initiator IGACURE OXE02 (Ciba Specialty Chemicals) | 0.5 |
| (D) Solvent | |
| PGMEA | 24.0 |
| ethylethoxy propionate | 11.4 |
| (E) Dye dispersion | 35.0 |
| B-009 (Kyungin, blue dye) | 5.0 |
| acryl-based binder resin | 10.0 |
| PGMEA (solvent) | 20.0 |
| (F) Additive | 0.1 |
| F-475 (DIC Co., Ltd., fluorine-based surfactant) | |

Manufacture of Color Filter Pattern

The photosensitive resin compositions according to Examples 1 to 3 and Comparative Example 1 and 2 are coated to be 3 µm thick on a glass substrate (a bare glass) with a spin-coater. A plurality of color filter patterns are formed by performing a soft-baking on a hot-plate at about 80° C. for about 120 seconds, performing an exposure with an exposer (Ushio, ghi broadband) at power of about 60 mJ, performing development at a development temperature of about 25° C. for a development time of about 60 seconds, performing a cleaning for about 60 seconds, and performing a spin-dry for about 25 seconds in a potassium hydroxide aqueous solution of a concentration of about 1 wt %.

Evaluation Examples (1) Evaluation of Chemical Resistance

Chemical resistances of the color filter patterns formed using the photosensitive resin compositions prepared according to Examples 1 to 3 and Comparative Examples 1 and 2 against a stripping solution are evaluated by dipping the color filter patterns in the stripping solution (EDM/MMP=2/8) of 80° C. for about 5 minutes.

The chemical resistance against the stripping solution is evaluated by a color change of the color filter patterns before and after the dipping in the stripping solution and whether the color filter patterns are delaminated after the dipping in the stripping solution.

The color change of the color filter patterns are measured using a spectrophotometer (MCPD3000 of Otsuka Electronics Corporation), and whether the color filter patterns are delaminated or not was evaluated with an optical microscope.

TABLE 4

|  | Color changes Bare glass | Peeling Bare glass |
| --- | --- | --- |
| Example 1 | Middle | Excellent |
| Example 2 | Middle | Excellent |
| Example 3 | Excellent | Excellent |
| Comparative Example 1 | Poor | Middle |
| Comparative Example 2 | Poor | Middle |

<Color Changes>
When the color change after the dipping in the stripping solution is weak: Excellent
When the color change after the dipping in the stripping solution is middle: Middle
When the color change after the dipping in the stripping solution is strong: Poor
<Peeling>
When a photosensitive resin composition film is not delaminated: Excellent
When a photosensitive resin composition film is a little delaminated: photosensitive resin composition: Middle
When most of a photosensitive resin composition film is delaminated: Poor (2) Evaluation of Heat Resistance Color filter patterns formed of the photosensitive resin compositions prepared according to Examples 1 to 4 and Comparative Examples 1 and 2 are subject to a heat treatment in an oven set to 230° C. for 30 minutes and their heat resistances are evaluated.

The heat resistances are evaluated by detecting the color changes of the color filter patterns before and after the heat treatment, and the color change is measured using a spectrophotometer (MCPD3000 of Otsuka Electronics Corporation).

TABLE 5

|  | Heat resistance Bare glass |
| --- | --- |
| Example 1 | Middle |
| Example 2 | Excellent |
| Example 3 | Excellent |
| Comparative Example 1 | Middle |
| Comparative Example 2 | Middle |

<Heat Resistance>
When a color change is weak after the heat treatment for 2 hours in an oven at about 230° C.: Excellent
When a color change is middle after the heat treatment for 2 hours in an oven at about 230° C.: Middle
When a color change is outstanding after the heat treatment for 2 hours in an oven at about 230° C.: Poor As shown in Tables 4 and 5, the films formed of the photosensitive resin compositions of Examples 1 to 3 according to the present invention exhibit a small color change and no peeling during a peeling solution treatment and excellent heat resistance. Based on the results, a photosensitive resin composition according to an exemplary embodiment of the present invention is found to show excellent resistance against a peeling solution and heat.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising
  (A) a dye-polymer composite wherein the dye includes a repeating unit derived from a compound represented by the following Chemical Formula 4;
  (B) a binder resin;
  (C) a photopolymerizable monomer;
  (D) a photopolymerization initiator; and
  (E) a solvent:

[Chemical Formula 4]

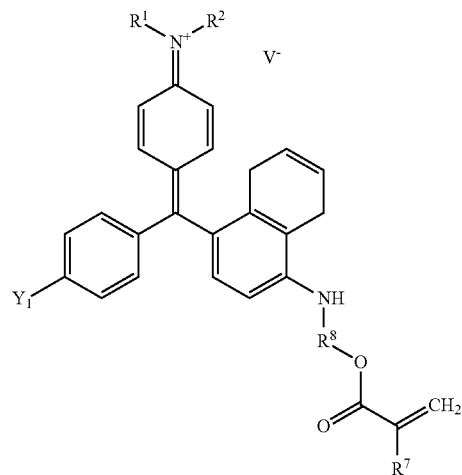

wherein, in the above Chemical Formula 4,
  $Y_1$ is $-NR^3R^4$, $-OR^5$, or $-SR^6$,
  $R^1$ to $R^6$ are the same or different and are each independently hydrogen, substituted or unsubstituted C1 to C30 alkyl, substituted or unsubstituted C6 to C30 aryl, substituted or unsubstituted C6 to C30 alkylaryl, substituted or unsubstituted C3 to C30 heteroaryl, or a combination thereof,
  $R^7$ is methyl,
  $R^8$ is substituted or unsubstituted C3 to C30 cycloalkylene, and
  $V^-$ is a counter ion of $N^+$.

2. The photosensitive resin composition for a color filter of claim 1, wherein the dye-polymer composite (A) includes a repeating unit derived from a compound represented by the above Chemical Formula 4 in an amount of about 0.1 to about 70 wt % based on total amount of the dye-polymer composite (A).

3. The photosensitive resin composition for a color filter of claim 1, wherein the photosensitive resin composition for a color filter comprises:
  about 0.5 to about 50 wt % of the dye-polymer composite (A);
  about 0.5 to about 20 wt % of the binder resin (B);
  about 0.5 to about 20 wt % of the photopolymerizable monomer (C);
  about 0.1 to about 10 wt % of the photopolymerization initiator (D); and
  a balance amount of the solvent (E).

4. The photosensitive resin composition for a color filter of claim 1, wherein the dye-polymer composite (A) has a weight average molecular weight (Mw) of about 1,000 to about 500,000 g/mol.

5. The photosensitive resin composition for a color filter of claim 1, wherein the dye-polymer composite (A) further comprises at least one of repeating units represented by the following Chemical Formulae 5 to 7 or a combination thereof:

[Chemical Formula 5]

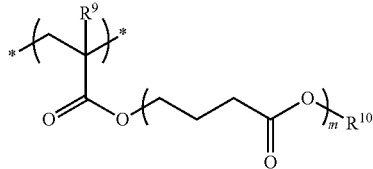

[Chemical Formula 6]

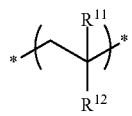

[Chemical Formula 7]

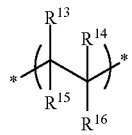

wherein, in the above Chemical Formulae 5 to 7,
$R^9$, $R^{10}$, $R^{11}$, $R^{13}$, and $R^{14}$ are the same or different and are each independently hydrogen, substituted or unsubstituted C1 to C30 alkyl, substituted or unsubstituted C6 to C30 aryl, substituted or unsubstituted C6 to C30 alkylaryl, or a combination thereof,
$R^{12}$ is substituted or unsubstituted C1 to C30 alkyl, substituted or unsubstituted C6 to C30 aryl, —CO—$R^{17}$—COOH wherein $R^{17}$ is substituted or unsubstituted C1 to C30 alkylene or substituted or unsubstituted C1 to C30 alkoxylene, or a combination thereof,
$R^{15}$ is —COOH or —CONH$R^{18}$ wherein $R^{18}$ is substituted or unsubstituted C1 to C30 alkyl or substituted or unsubstituted C6 to C30 aryl,
$R^{16}$ is —COOH,
or $R^{15}$ and $R^{16}$ are fused with each other to form a ring, and
m is an integer of 0 to 5.

6. The photosensitive resin composition for a color filter of claim 5, wherein the dye-polymer composite (A) includes at least one of the repeating units represented by the above Chemical Formulae 5 to 7 in an amount of about 0.1 to about 70 wt % based on the total amount of the dye-polymer composite (A).

7. The photosensitive resin composition for a color filter of claim 1, wherein the binder resin (B) is a cardo-based resin, an acrylic-based resin, or a combination thereof.

8. The photosensitive resin composition for a color filter of claim 1, wherein the photosensitive resin composition for a color filter comprises a pigment, a dye, or a combination thereof in an amount of about 0.1 to about 40 wt %.

9. A color filter manufactured by using the photosensitive resin composition according to claim 1.

10. The photosensitive resin composition for a color filter of claim 1, wherein $R^8$ is cyclohexylene.

11. A photosensitive resin composition for a color filter, comprising
(A) a dye-polymer composite wherein the dye includes a repeating unit derived from a compound represented by the following Chemical Formula 4;
(B) a cardo-based binder resin;
(C) a photopolymerizable monomer;
(D) a photopolymerization initiator; and
(E) a solvent:

[Chemical Formula 4]

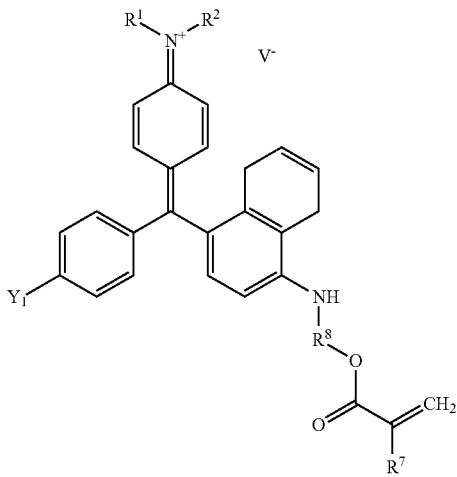

wherein, in the above Chemical Formula 4,
$Y_1$ is —NR$^3$R$^4$, —OR$^5$, or —SR$^6$,
$R^1$ to $R^6$ are the same or different and are each independently hydrogen, substituted or unsubstituted C1 to C30 alkyl, substituted or unsubstituted C6 to C30 aryl, substituted or unsubstituted C6 to C30 alkylaryl, substituted or unsubstituted C3 to C30 heteroaryl, or a combination thereof,
$R^7$ is methyl,
$R^8$ is substituted or unsubstituted C3 to C30 cycloalkylene, and
$V^-$ is a counter ion of $N^+$.

* * * * *